(12) United States Patent
Lin et al.

(10) Patent No.: US 7,722,386 B2
(45) Date of Patent: May 25, 2010

(54) FLEXIBLE PRINTED CIRCUIT WITH PRIMARY AND SECONDARY BODIES

(75) Inventors: Wen-Bin Lin, Shenzhen (CN); Chih-Hung Chang, Miao-Li (TW)

(73) Assignees: Innocom Technology (ShenZhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 61 days.

(21) Appl. No.: 11/978,408

(22) Filed: Oct. 29, 2007

(65) Prior Publication Data

US 2008/0102656 A1    May 1, 2008

(30) Foreign Application Priority Data

Oct. 27, 2006    (CN) .............................. 95139816 A (51) Int. Cl.
*H01R 12/24* (2006.01)
(52) U.S. Cl. ...................................... 439/495
(58) Field of Classification Search .................. 439/495, 439/497–499, 67; 361/760; 174/254
See application file for complete search history.

(56) References Cited

U.S. PATENT DOCUMENTS

| 7,121,874 | B1 | 10/2006 | Jeon | |
|---|---|---|---|---|
| 7,245,503 | B2 * | 7/2007 | Koga | ........................... 361/760 |
| 7,527,418 | B2 * | 5/2009 | Lin et al. | ..................... 362/633 |
| 2006/0221274 | A1 * | 10/2006 | Lv et al. | ....................... 349/70 |

* cited by examiner

*Primary Examiner*—Javaid Nasri
(74) *Attorney, Agent, or Firm*—Wei Te Chung (57) ABSTRACT

An exemplary flexible printed circuit (20) includes a primary body (210) and a secondary body (220). The primary body includes a primary connection portion (211), and a primary engaging portion. The secondary body includes a secondary connection portion (221) and a secondary engaging portion (223). The primary body and the secondary body are electrically connected by connecting the primary engaging portion and the secondary engaging portion together.

2 Claims, 7 Drawing Sheets

FLEXIBLE PRINTED CIRCUIT WITH PRIMARY AND SECONDARY BODIES

FIELD OF THE INVENTION

The present invention relates to flexible printed circuits (FPCs), and more particularly to a flexible printed circuit having two or more bodies for connecting different electronic circuits.

GENERAL BACKGROUND

Quite a few electronic appliances such as liquid crystal displays need a flexible printed circuit to connect a variety of electronic circuits together.

Figure 11:
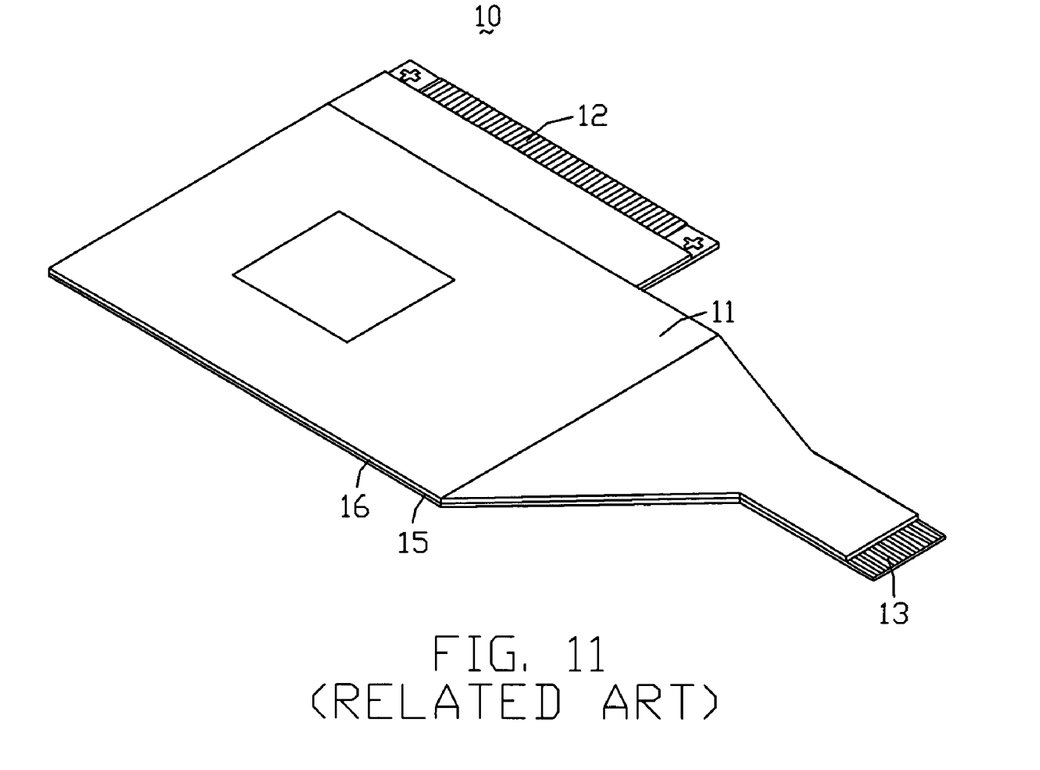
FIG. 11 is an isometric view of a conventional flexible printed circuit.

Referring to FIG. 11, a typical flexible printed circuit 10 includes a main body 11, a first connection body 12, and a second connection body 13. The main body 11 has a generally rectangular structure. The first and second connection bodies 12, 13 are respectively connected to two adjacent edges of the main body 11. The main body 11 as well as the first connection body 12 and the second connection body 13 is comprised of a metal wire layer 15 having a plurality of conductive metal wires, and an insulation layer 16 formed on the metal wire layer 15. The first and second connection bodies 12, 13 are electrically connected to the main body 11 through the metal wires.

A portion of the metal wire layer 15 located at the free end of the first connection body 12 is exposed, thus the metal wires can be connected with a mating connector (not shown) of an electrical circuit of an associated electronic component. A free end of the second connecting portion 13 is similar to the free end of the first connecting portion 12. However, a layout design of metal wires is different. The first connection body 12 is connected to an electrical circuit having a first joint interface. The second connection body 13 is connected to another electrical circuit having a second joint interface. If the first joint interface is wider than the second joint interface, a width of the end portion of the first connection body 12 is correspondingly wider than a width of the end portion of the second connection body 13, and vice versa. That is, the layout design of the first and second connection bodies 12, 13 is with the aim of making the width of the end portions of the first and second connection bodies 12, 13 equal to the width of electrical circuits corresponding to the first and second connection bodies 12, 13.

However, the first and second connection bodies 12, 13 of the flexible printed circuit 10 can only connect with specified electrical circuits respectively. When the flexible printed circuit 10 needs an improvement, or the specified connectors are changed to different ones (e.g. according to new user requirements), the flexible printed circuit needs be replaced with a new flexible printed circuit 10. Thus the production cost of an electronic appliance employing the flexible printed circuit 10 is increased, and the manufacturing of the electronic appliance may be delayed.

What is needed, therefore, is a flexible printed circuit that can overcome the above-described deficiencies.

SUMMARY

In one preferred embodiment, a flexible printed circuit includes a primary body and a secondary body. The primary body includes a primary connection portion, and a primary engaging portion. The secondary body includes a secondary connection portion and a secondary engaging portion. The primary body and the secondary body are electrically connected by connecting the primary engaging portion and the secondary engaging portion together.

Other aspects, novel features and advantages will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of at least one embodiment of the present invention. In the drawings, like reference numerals designate corresponding parts throughout various views, and all the views are schematic.

DETAILED DESCRIPTION OF PREFERRED EMBODIMENTS

Reference will now be made to the drawings to describe the preferred embodiments in detail.

Figure 1:
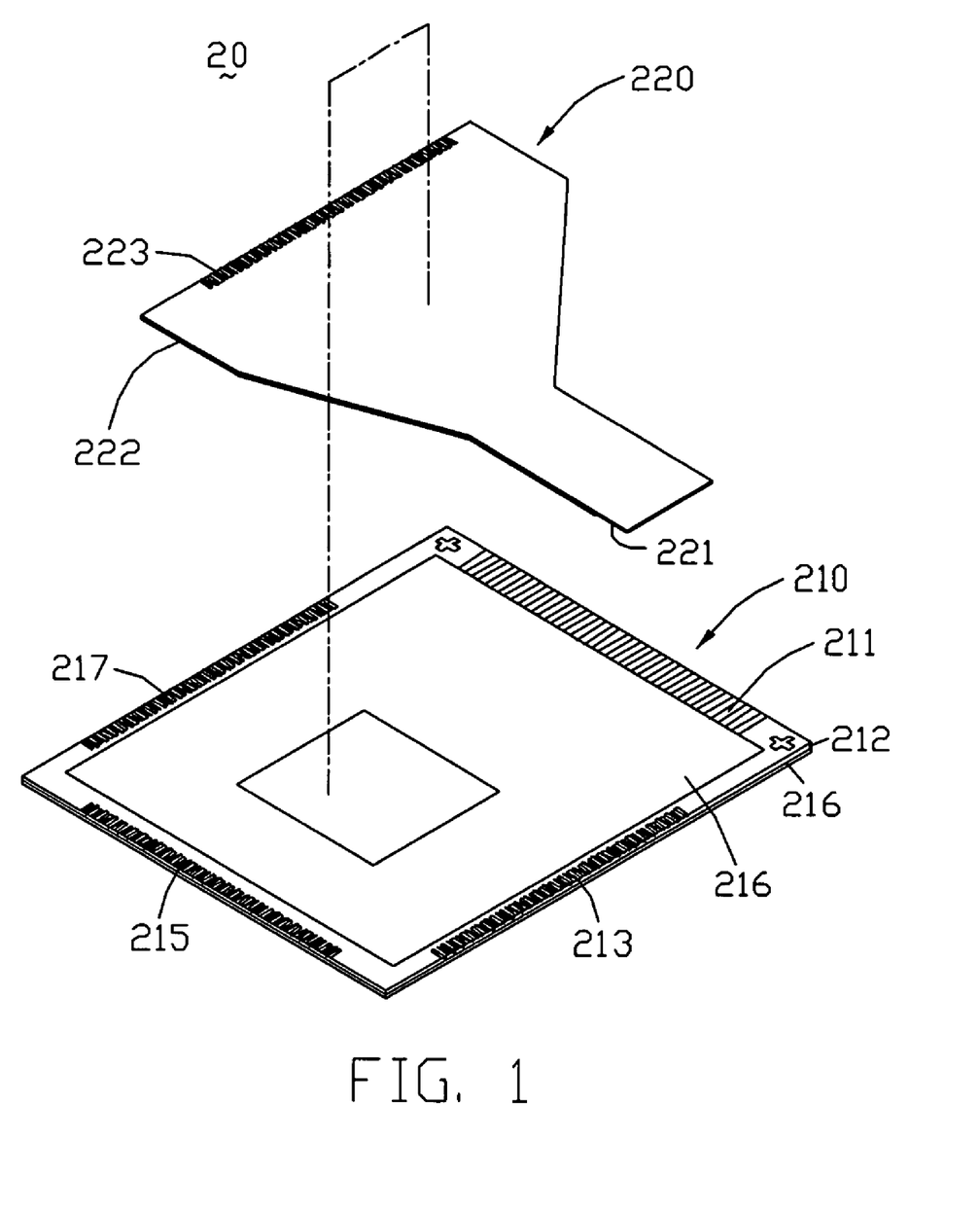
FIG. 1 is an exploded, isometric view of a flexible printed circuit according to a first embodiment of the present invention, the flexible printed circuit including a primary body and a secondary body, the primary body including a first engaging portion, the secondary body including a fourth engaging portion.

Referring to FIG. 1, a flexible printed circuit 20 according to a first embodiment of the present invention is shown. The flexible printed circuit 20 includes a primary body 210, and a secondary body 220 electrically connectable to the primary body 210.

The primary body 210 is formed of a first metal wire layer 212 having a plurality of conductive metal wires and two first insulation layers 216. The first metal wire layer 212 is interposed between the two first insulation layers 216. The first metal wire layer 212 and the first insulation layer 216 are generally rectangular. The primary body 210 defines a primary connection portion 211, a first primary engaging portion 213, a second primary engaging portion 215, and a third primary engaging portion 217, which are arranged at four edge portions of the primary body 210. The first, second, and third primary engaging portions 213, 215, 217 have the same specifications, such as a density of metal wires, a width, and a length. The first connection portion 211 is configured for connecting to a first connector (not shown).

The secondary body 220 is formed of a second metal layer 221 having a plurality of conductive metal wires, and a second insulation layer 222. The second insulation layer 222 is formed on the second metal layer 221. The secondary body 220 includes a secondary engaging portion 223, and a secondary connection portion 221. The secondary engaging portion 223 has a same width, length and density of metal wires as each of the first, second, and third primary engaging portions 213, 215, 217. The secondary engaging portion 223 can be connected to any one of the first, second, or third primary engaging portions 213, 215, 217. The secondary connection portion 221 is configured for connecting to a second connector (not shown).

Figure 2:
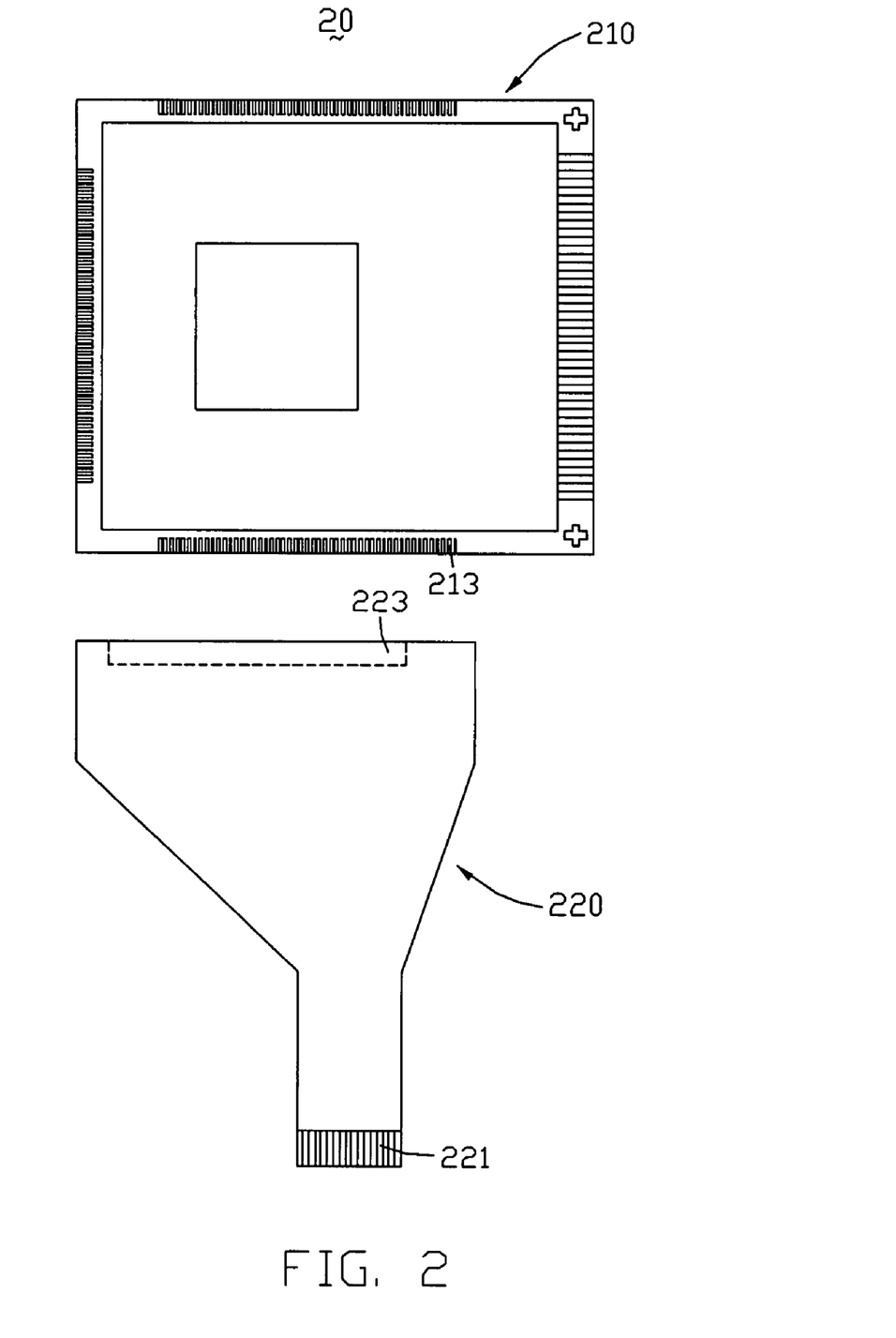
FIG. 2 is an exploded, top plan view of the flexible printed circuit of FIG. 1, the fourth engaging portion being positioned corresponding to the first engaging portion.

Referring also to FIG. 2, the secondary engaging portion 223 of the secondary body 220 is positioned corresponding to the first primary engaging portion 213 of the primary body 210. The secondary engaging portion 223 and the first primary engaging portion 213 can be soldered or adhered together.

If the secondary body 220 needs to be connected to a connector with a different joint interface, the secondary body 220 can be redesigned. The secondary connection portion 221 corresponds to the joint interface of the connector, and the secondary engaging portion 223 remains the same.

With the above-described structure, the flexible printed circuit 20 is most cost-effective. Only the secondary body 220 needs to be redesigned for mating various connectors having different joint interfaces. Furthermore, a plurality of secondary bodies 220 with various joint interfaces can be pre-designed and manufactured for storage.

Figure 3:
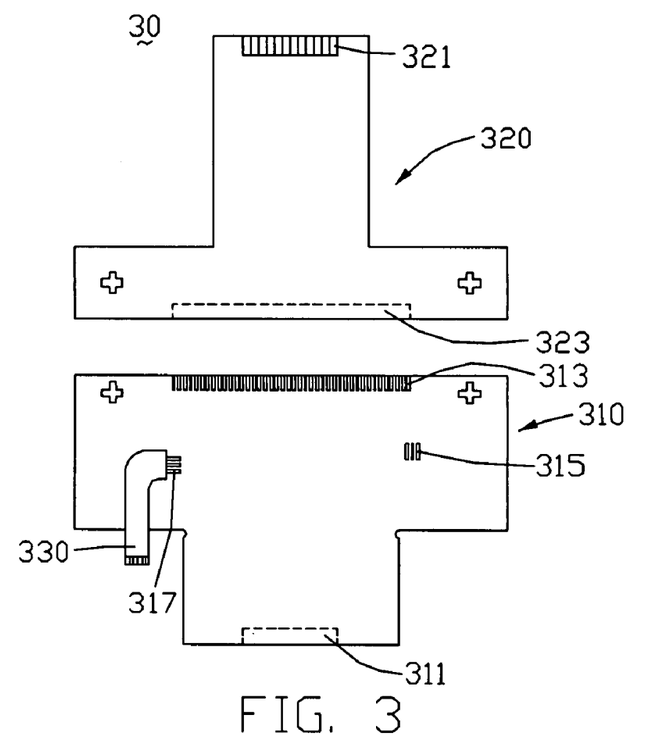
FIG. 3 is an exploded, top plan view of a flexible printed circuit according to a second embodiment of the present invention, the flexible printed circuit including a primary body and a secondary body, the primary body including a first connection portion, a first sub-portion and a second sub-portion, the secondary body being generally T-shaped.

Referring to FIG. 3, a flexible printed circuit 30 according to a second embodiment of the present invention is shown. The flexible printed circuit 30 includes a primary body 310, and a secondary body 320 electrically connected to the primary body 310.

The primary body 310 includes a primary connection portion 311, a primary engaging portion 313, a first sub-portion 315, a second sub-portion, and a plurality of metal wires (not shown). The primary connection portion 311 is positioned at a narrower edge portion of the primary body 310. The primary engaging portion 313 is positioned at a wider edge portion opposite to the primary connection portion 311. The first sub-portion 315 and the second sub-portion 317 are disposed on the primary body 310 between the primary engaging portion 313 and the primary connection portion 311. The primary engaging portion 313, the first sub-portion 315 and the second sub-portion 317 are electrically connected to the primary connection portion 311 via the metal wires. The metal wires are sandwiched between two insulation layers.

The secondary body 320 has a generally T-shaped structure. The secondary body 320 includes a secondary connection portion 321, a secondary engaging portion 323, and a plurality of metal wires (not shown). The secondary engaging portion 323 is positioned at a wider edge portion of the secondary body 320. The secondary connection portion 321 is positioned at a narrower edge portion of the secondary body 320. The secondary connection portion 321 is electrically connected to the secondary engaging portion 323 via the metal wires. The metal wires are covered by an insulation layer.

Figure 4:
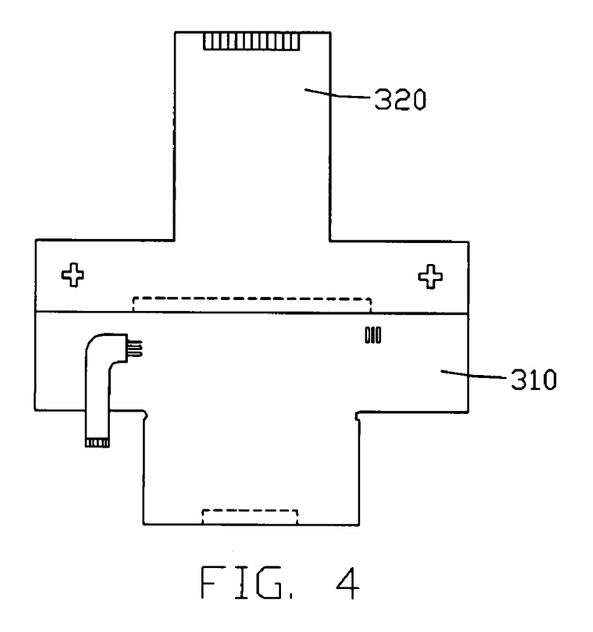
FIG. 4 is similar to FIG. 3, but showing the primary and secondary bodies connected together.

Referring also to FIG. 4, the primary body 310 and the secondary body 320 are attached together. The primary and secondary engaging portions 313, 323 have the same specifications in density of metal wires, width, and length. The primary and secondary engaging portions 313, 323 can be connected together by soldering or adhesive. Thus, the primary body 310 and the secondary body 320 are electrically connected to each other.

The first sub-portion 315 and the second sub-portion 317 are joint interfaces, and can be connected to electrical circuits or other electrical components. In the illustrated embodiment, the second sub-portion 317 is connected to a sub-circuit 330.

The primary connection portion 311 and the secondary connection portion 321 are connected to electrical circuits with the specified joint interfaces. If the secondary body 320 needs to be connected to an electrical circuit with a different joint interface, the secondary body 320 is redesigned. The secondary connection portion 321 corresponds to the joint interface of the connector, and the secondary engaging portion 323 remains the same as the former joint interface.

Figure 5:
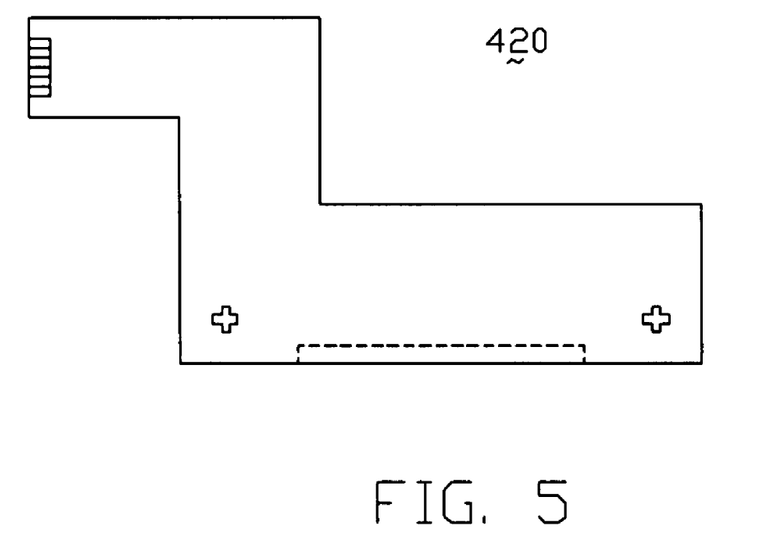
FIG. 5 a top plan view of a generally Z-shaped secondary body of a flexible printed circuit according to a third embodiment of the present invention.

Referring to FIG. 5, a secondary body 420 of an FPC according to a third embodiment of the present invention is generally Z-shaped.

Figure 6:
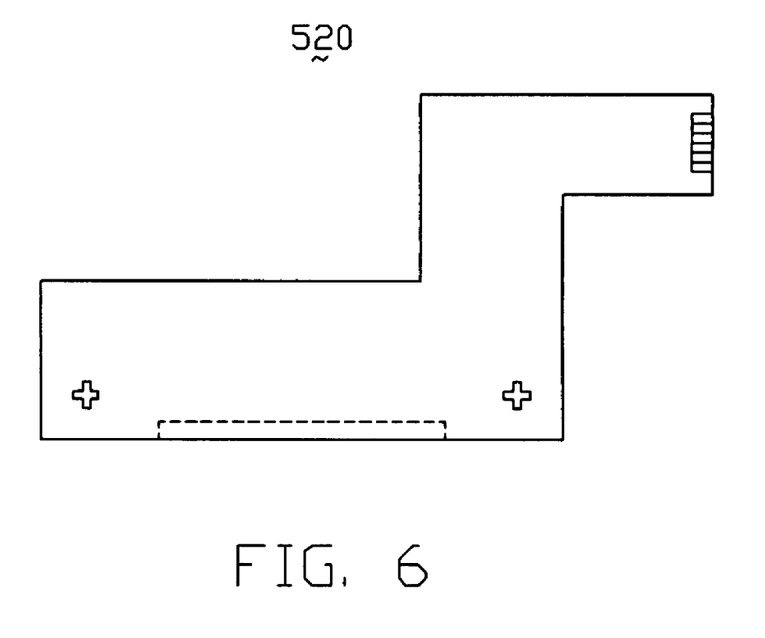
FIG. 6 is a top plan view of a generally reverse Z-shaped secondary body of a flexible printed circuit according to a fourth embodiment of the present invention.

Referring also to FIG. 6, a secondary body 520 of an FPC according to a fourth embodiment of the present invention is generally reverse Z-shaped.

Figure 7:
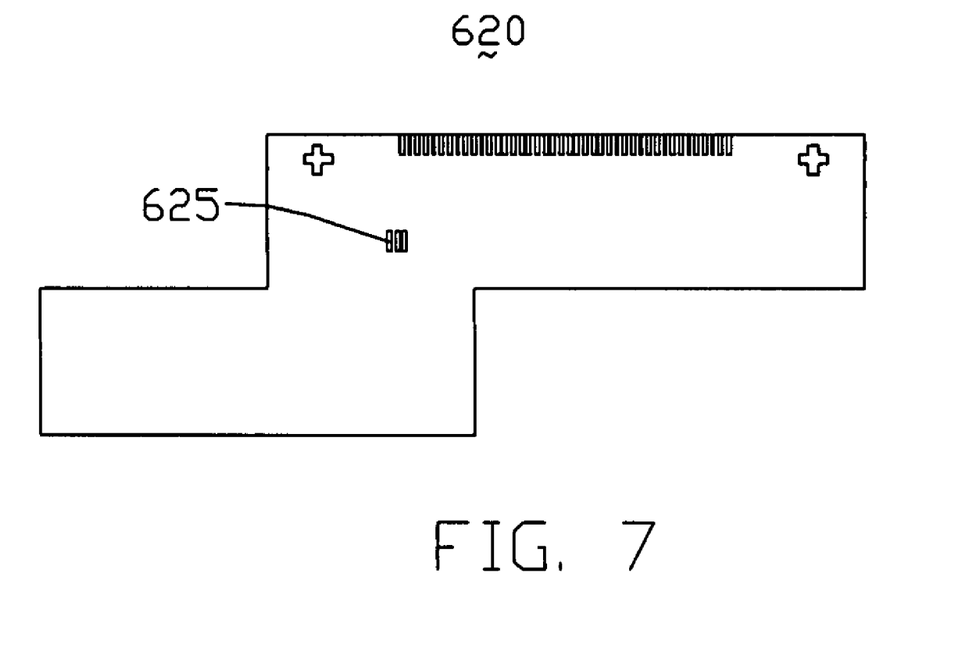
FIG. 7 is a top plan view of a generally reverse Z-shaped primary body of a flexible printed circuit according to a fifth embodiment of the present invention, the primary body including a first sub-portion.

Referring also to FIG. 7, a primary body 620 of an FPC according to a fifth embodiment of the present invention is generally reverse Z-shaped. The primary body 620 includes a first sub-portion 625.

Figure 8:
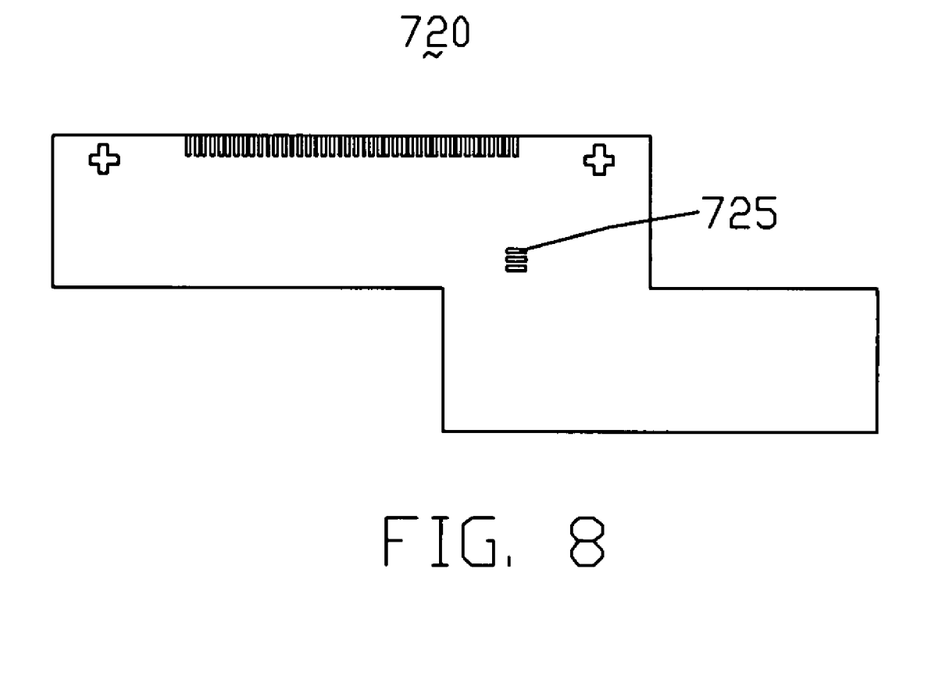
FIG. 8 is a top plan view of a generally Z-shaped primary body of a flexible printed circuit according to a sixth embodiment of the present invention, the primary body including a first sub-portion.

Referring also to FIG. 8, a primary body 720 of an FPC according to a sixth embodiment of the present invention is generally Z-shaped. The primary body 720 includes a first sub-portion 725.

Figure 9:
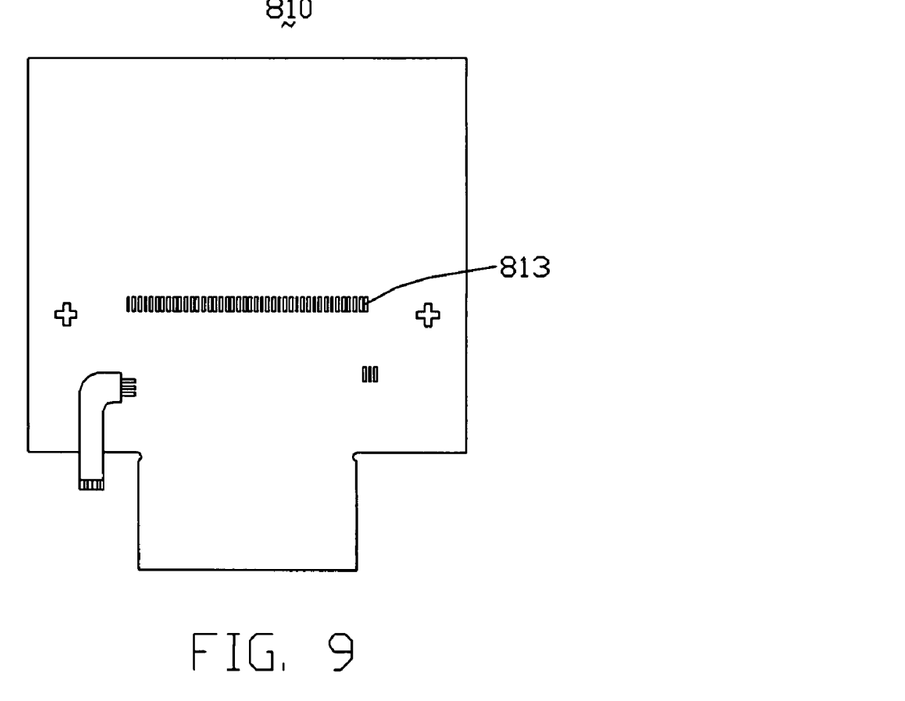
FIG. 9 is a top plan view of a primary body of a flexible printed circuit according to a seventh embodiment of the present invention, the primary body including a primary engaging portion positioned in a middle thereof.
Figure 10:
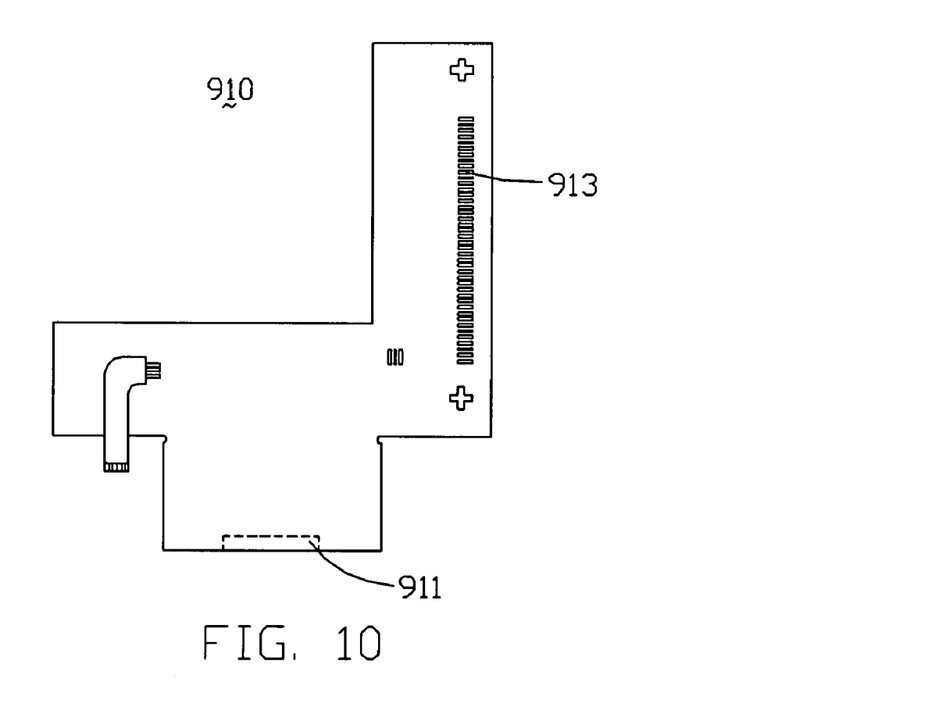
FIG. 10 is a top plan view of a generally reverse L-shaped primary body of a flexible printed circuit according to an eighth embodiment of the present invention, the primary body including a primary engaging portion positioned at a long edge portion thereof.

Referring to FIG. 9, a primary body 810 of an FPC according to a seventh embodiment of the present invention is shown. The primary body 810 includes a primary engaging portion 813 positioned in middle thereof. Referring to FIG. 10, a primary body 910 of an FPC according to an eighth embodiment of the present invention is shown. The primary body 910 has a generally reverse L-shaped configuration, and includes a primary engaging portion 913 positioned in at a wide edge portion thereof and a primary connection portion 911 positioned at a narrow edge portion thereof.

It is believed that the present embodiments and their advantages will be understood from the foregoing description, and it will be apparent that various changes may be made thereto without departing from the spirit or scope of the invention or sacrificing all of its material advantages, the examples hereinbefore described merely being preferred or exemplary embodiments of the invention.

What is claimed is:

1. A flexible printed circuit comprising:
   a primary body comprising a primary connection portion and three primary engaging portions all with the same specifications, the primary body being generally rectangular, and the primary connection portion and the three primary engaging portions being arranged at four edge portions of the primary body respectively; and a secondary body comprising a secondary connection portion and a secondary engaging portion, wherein the primary body and the secondary body are electrically connected by connecting one of the primary engaging portions and the secondary engaging portion together.

2. The flexible printed circuit in claim 1, wherein the three primary engaging portions are of a same width, length and density of metal wires.

* * * * *